(12) United States Patent
Higashionji et al.

(10) Patent No.: US 7,679,265 B2
(45) Date of Patent: Mar. 16, 2010

(54) DRIVE UNIT

(75) Inventors: Masaru Higashionji, Osaka (JP);
Hideaki Mukae, Hyogo (JP); Yusuke Adachi, Osaka (JP); Eiichi Nagaoka, Hyogo (JP)

(73) Assignee: Panasonic Corporation, Kadoma (JP)

( * ) Notice: Subject to any disclaimer, the term of this patent is extended or adjusted under 35 U.S.C. 154(b) by 0 days.

(21) Appl. No.: 12/114,891

(22) Filed: May 5, 2008

(65) Prior Publication Data
US 2008/0278037 A1 Nov. 13, 2008

(30) Foreign Application Priority Data
May 7, 2007 (JP) .............................. 2007-122574

(51) Int. Cl.
*H01L 41/08* (2006.01)
(52) U.S. Cl. .............................. 310/323.02; 310/316.02
(58) Field of Classification Search ............ 310/316.01, 310/316.02, 323.02, 328
See application file for complete search history.

(56) References Cited

U.S. PATENT DOCUMENTS

| | | | | |
|---|---|---|---|---|
| 5,144,187 A | * | 9/1992 | Culp | .......................... 310/328 |
| 6,664,711 B2 | * | 12/2003 | Baudendistel | .......... 310/323.02 |
| 6,798,117 B2 | * | 9/2004 | Johansson et al. | ...... 310/323.02 |
| 6,897,598 B2 | * | 5/2005 | Kato et al. | ............. 310/323.02 |
| 7,161,278 B2 | * | 1/2007 | Johansson | ................... 310/328 |
| 7,439,650 B2 | * | 10/2008 | Sawada | ................. 310/316.02 |

FOREIGN PATENT DOCUMENTS

| | | |
|---|---|---|
| JP | 05-038165 | 2/1993 |
| JP | 2966590 | 8/1999 |
| JP | 2002-374686 | 12/2002 |

* cited by examiner

*Primary Examiner*—Mark Budd
(74) *Attorney, Agent, or Firm*—Renner, Otto, Boisselle & Sklar, LLP

(57) ABSTRACT

A drive unit includes a guide, a stage which is movable relative to the guide, an ultrasonic actuator for moving the movable body and a control unit for controlling the ultrasonic actuator. The ultrasonic actuator includes a driver element in contact with the stage and is fixed to the guide. A surface of the stage in contact with the driver element is an undulating surface. The control unit detects the position of the stage based on a change in contact pressure on the driver element due to the undulating surface.

4 Claims, 17 Drawing Sheets

DRIVE UNIT

BACKGROUND OF THE INVENTION

1. Field of the Invention

The present invention relates to a drive unit for moving a movable body relative to a stationary body using a vibration actuator.

2. Description of Related Art

A drive unit including a vibration actuator has been known. For example, the drive unit has been used in ultrasonic motors and devices which make small step-by-step displacement.

Such a drive unit is required to not only move the movable body but also control the position of the movable body. For example, a drive unit disclosed by Japanese Unexamined Patent Publication No. 2002-374686 includes an optical linear encoder as a position detection sensor. The present position of the movable body is detected by the optical linear encoder and a driving signal to the vibration actuator is controlled based on the present position.

SUMMARY OF THE INVENTION

If the position detection sensor is included in the drive unit, the cost and size of the drive unit increase. For example, if a position detection sensor which requires a scale covering the entire moving range of the movable body is used, the increase in size will be particularly significant. As there are many small-sized vibration actuators, the increase in size due to the provision of the position detection sensor presents a problem. From this aspect, a simple and cost-effective configuration for the position detection has been demanded.

In this connection, it is possible to calculate the position of the movable body from a period for feeding a piezoelectric element or a driving frequency. In this method, however, the movement of a drive element may be estimated but the position of the movable body may not be precisely estimated because a driving force output from the driver element is not completely transmitted to the movable body due to slip which may occur between the driver element and the movable body.

From the above-described aspect, the present invention has been achieved. An object of the invention is to provide a simple configuration for detecting the position of the movable body.

The present invention is directed to a drive unit including: a stationary body; a movable body which is movable relative to the stationary body; a vibration actuator using a piezoelectric element for moving the movable body; and a control section for controlling the vibration actuator by feeding the piezoelectric element. The vibration actuator includes a driver element in contact with one of the movable body and the stationary body and is fixed to the other one of the movable body and the stationary body. A surface of the one of the movable body and the stationary body in contact with the driver element is an undulating surface. The control section detects the position of the movable body based on a change in contact pressure on the driver element due to the undulating surface.

According to the present invention, the surface of the one of the stationary body and the movable body in contact with the driver element is provided with undulations. Therefore, contact pressure exerted on the driver element varies as the driver element drives the movable body and the position of the movable body is detected based on the change in pressure applied to the driver element. Thus, the position of the movable body is detected by a simple configuration without providing an additional position detection sensor.

BRIEF DESCRIPTION OF THE DRAWINGS

FIG. 10A shows the stage not driven yet, FIG. 10B shows the stage driven by one of driver elements as the actuator body stretches in the lengthwise direction and FIG. 10C shows the stage driven by the other driver element as the actuator body contracts in the lengthwise direction.

DETAILED DESCRIPTION OF THE INVENTION

Hereinafter, an embodiment of the present invention will be described with reference to the drawings.

Embodiment 1

Figure 1:
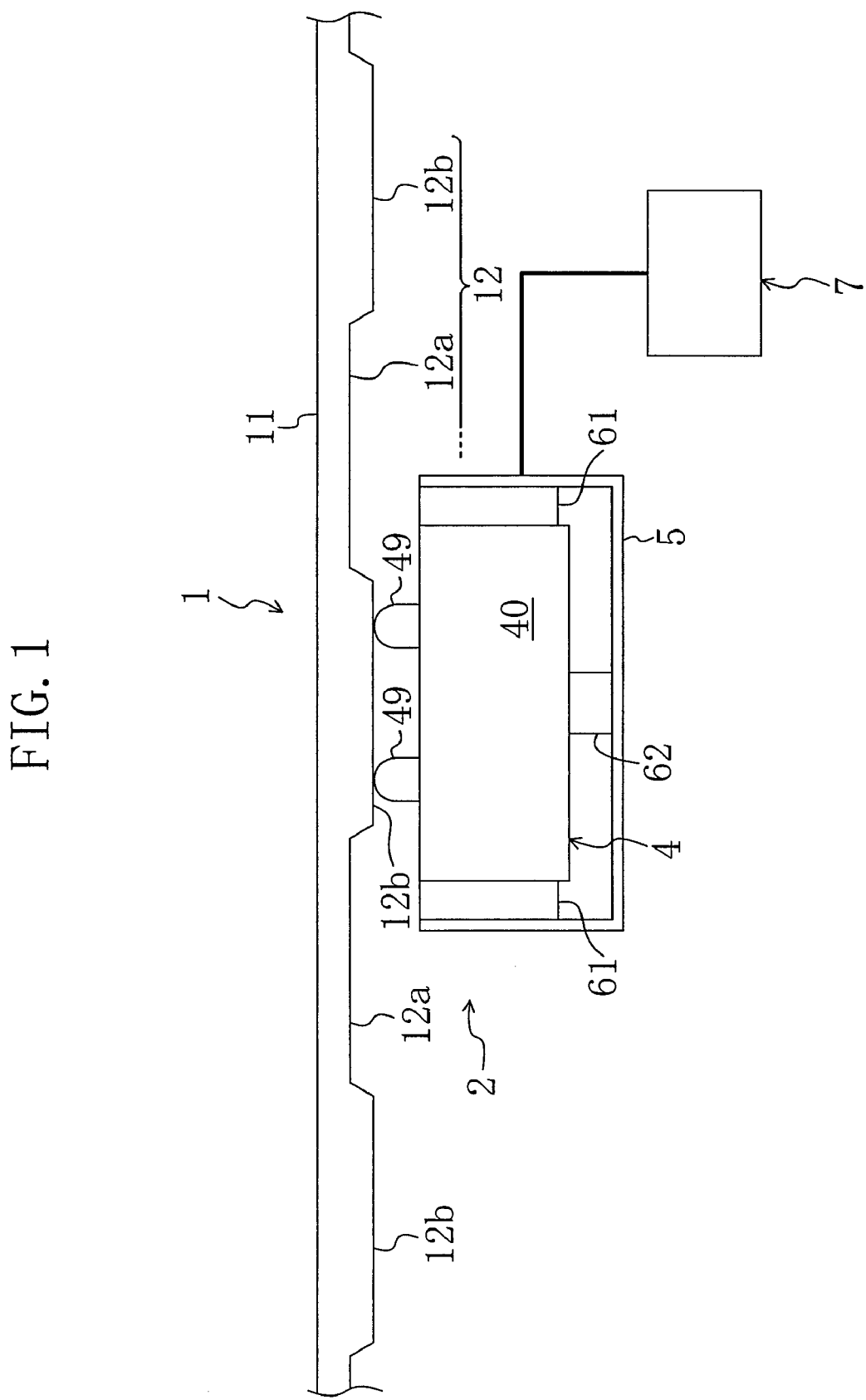
FIG. 1 is a schematic front view illustrating a drive unit according to Embodiment 1 of the present invention.
Figure 2:
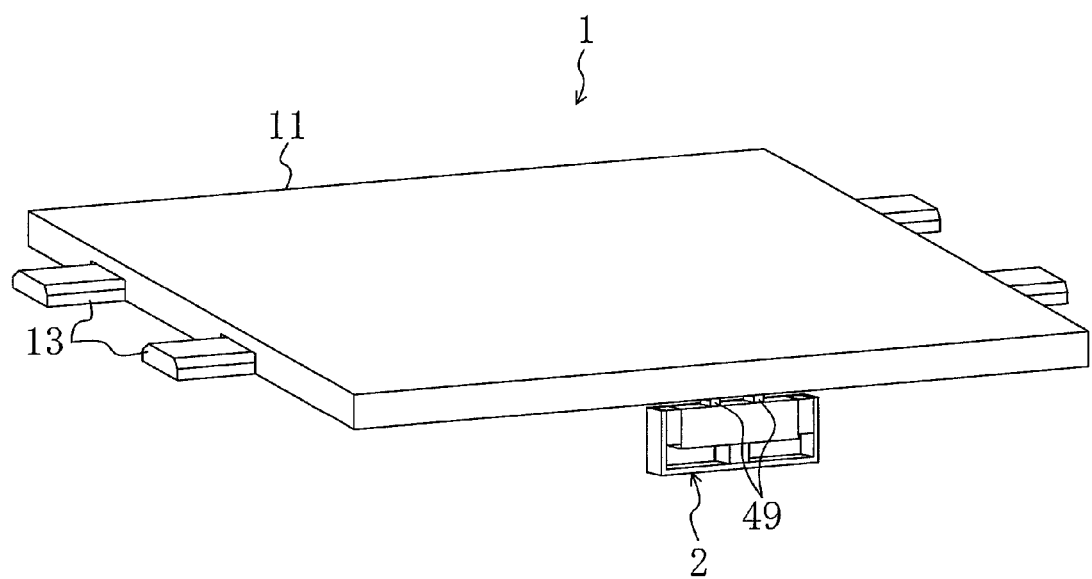
FIG. 2 is a perspective view of the drive unit.

A drive unit 1 according to an embodiment of the invention includes, as shown in FIGS. 1 and 2, a stage 11, an ultrasonic actuator 2 and a control unit 7 for controlling and driving the ultrasonic actuator 2.

The stage 11 is slidably attached to guides 13 fixed in parallel with each other to a base (not shown) as a stationary body. That is, the stage 11 is movable in the extending direction of the guides 13 (the extending direction of the guides 13 is the moving direction of the stage 11). The stage 11 is a plate-like member and substantially square-shaped when viewed in plan. The ultrasonic actuator 2 is arranged such that driver elements 49 described later come into contact with the rear surface of the stage 11 (the surface on which the guides 13 are provided). The stage 11 functions as a movable body and the base and the guides 13 function as a stationary body.

Figure 3:
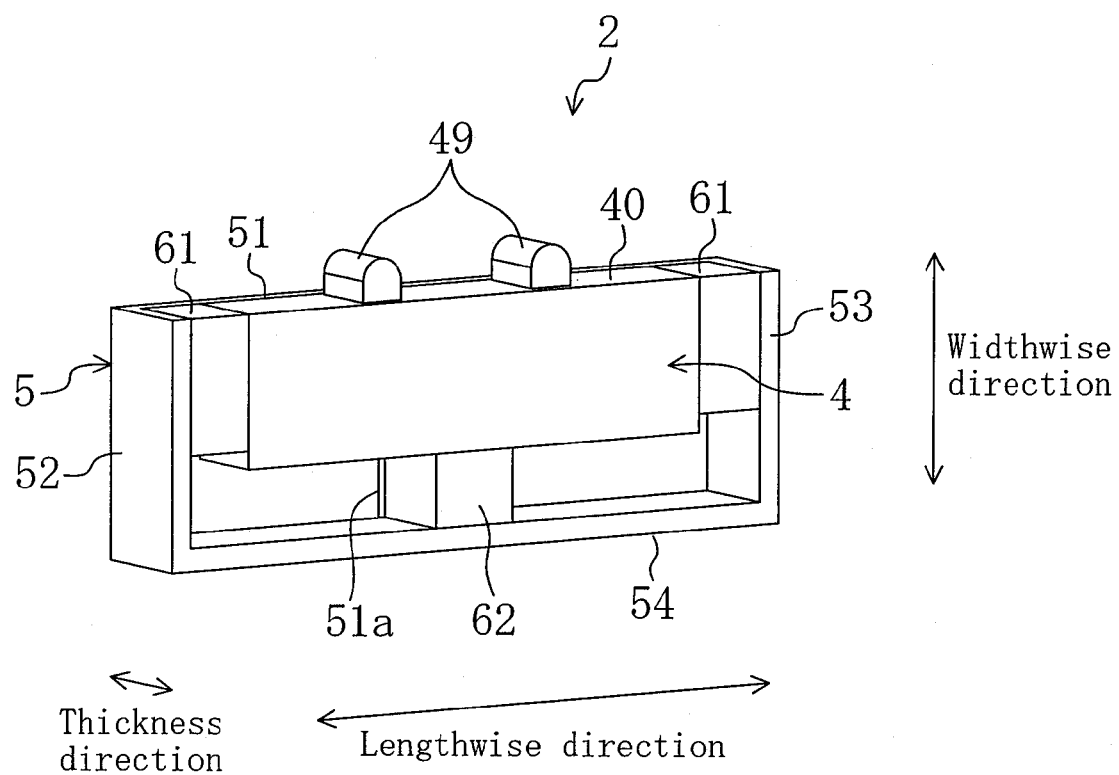
FIG. 3 is a perspective view of an ultrasonic actuator.

The ultrasonic actuator 2 includes, as shown in FIG. 3, an actuator body 4 which generates vibration, driver elements 49 for transmitting the driving force of the actuator body 4 to the stage 11, a case 5 for containing the actuator body 4, support rubbers 61 interposed between the actuator body 4 and the case 5 to elastically support the actuator body 4, and a bias rubber 62 for biasing the actuator body 4 to the stage 11. The ultrasonic actuator 2 functions as a vibration actuator.

The actuator body 4 comprises a piezoelectric element unit 40.

The piezoelectric element unit 40 is substantially in the form of a rectangular parallelepiped and has a pair of substantially rectangular principle surfaces facing each other, a pair of long side surfaces facing each other and extending in the lengthwise direction of the principle surfaces to be orthogonal to the principle surfaces and a pair of short side surfaces facing each other and extending in the widthwise direction of the principle surfaces to be orthogonal to both of the principle surfaces and the long side surfaces.

Figure 4:
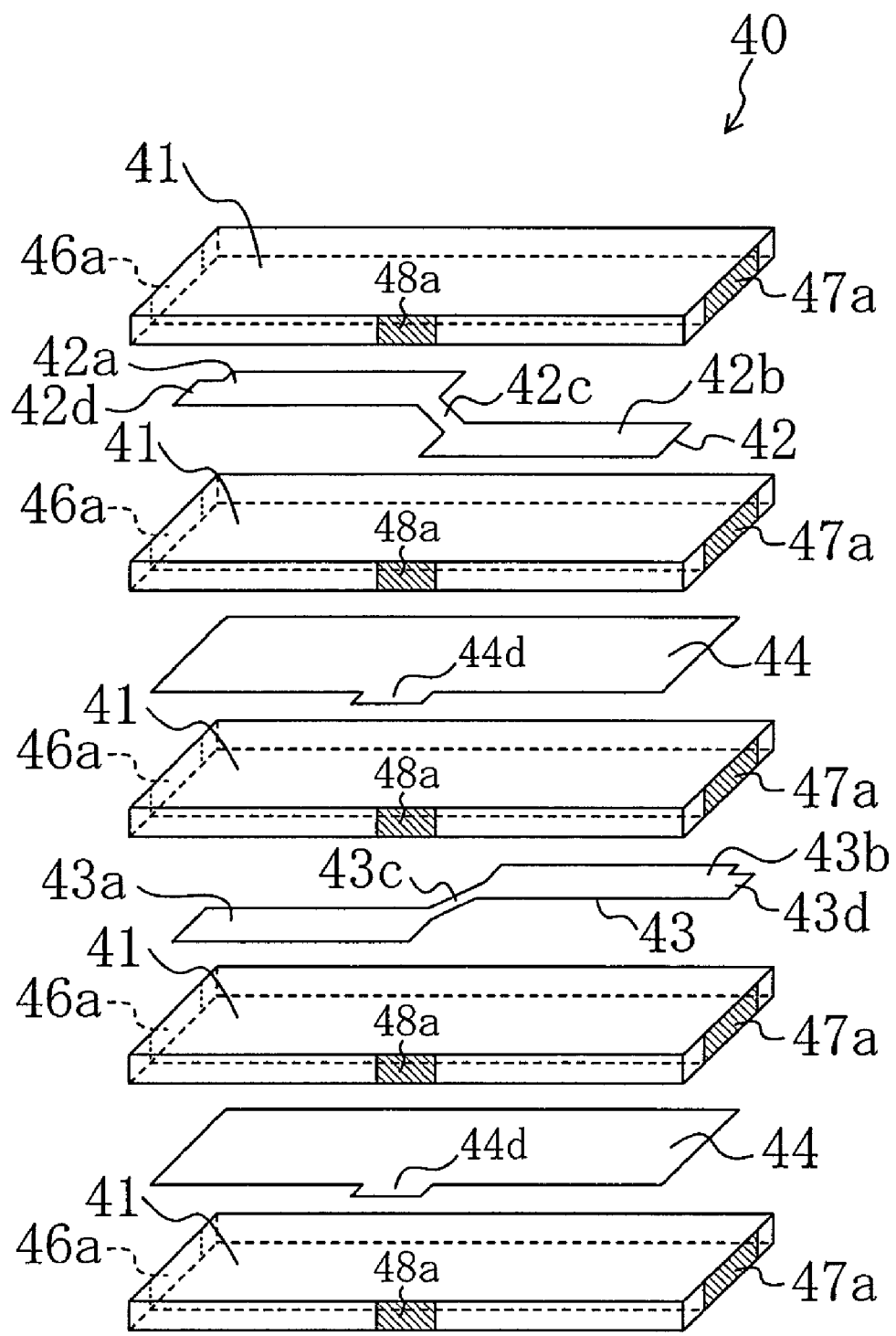
FIG. 4 is an exploded perspective view of a piezoelectric element unit.

As shown in FIG. 4, the piezoelectric element unit 40 is provided by alternately stacking five piezoelectric layers (piezoelectric elements) 41 and four internal electrode layers 42, 44, 43 and 44. Specifically, the internal electrode layers 42, 44, 43 and 44 are a first positive electrode layer 42, a common negative electrode layer 44, a second positive electrode layer 43 and a common negative electrode layer 44 stacked in this order alternately with the piezoelectric layers 41. The first positive electrode layer 42, the second positive electrode layer 43 and the common negative electrode layers 44 are printed on the principle surfaces of the piezoelectric layers 41, respectively.

Each of the piezoelectric layers 41 is an insulating layer made of ceramic such as lead zirconate titanate. Just like the piezoelectric element unit 40, the piezoelectric layer 41 is substantially in the form of a rectangular parallelepiped and has a pair of principle surfaces, a pair of long side surfaces and a pair of short side surfaces. Each of the piezoelectric layers 41 is provided with an external electrode 48a formed in the middle of one of the long side surfaces in the lengthwise direction, an external electrode 46a formed in the middle of one of the short side surfaces in the widthwise direction and an external electrode 47a formed in the middle of the other short side surface in the widthwise direction.

Each of the common negative electrode layers 44 is substantially rectangular and covers almost all the principle surface of the piezoelectric layer 41. The common negative electrode layer 44 has a lead electrode 44d extending from the middle of one of the long sides of the common negative electrode layer 44 in the lengthwise direction to the external electrode 48a of the piezoelectric layer 41.

Figure 5:
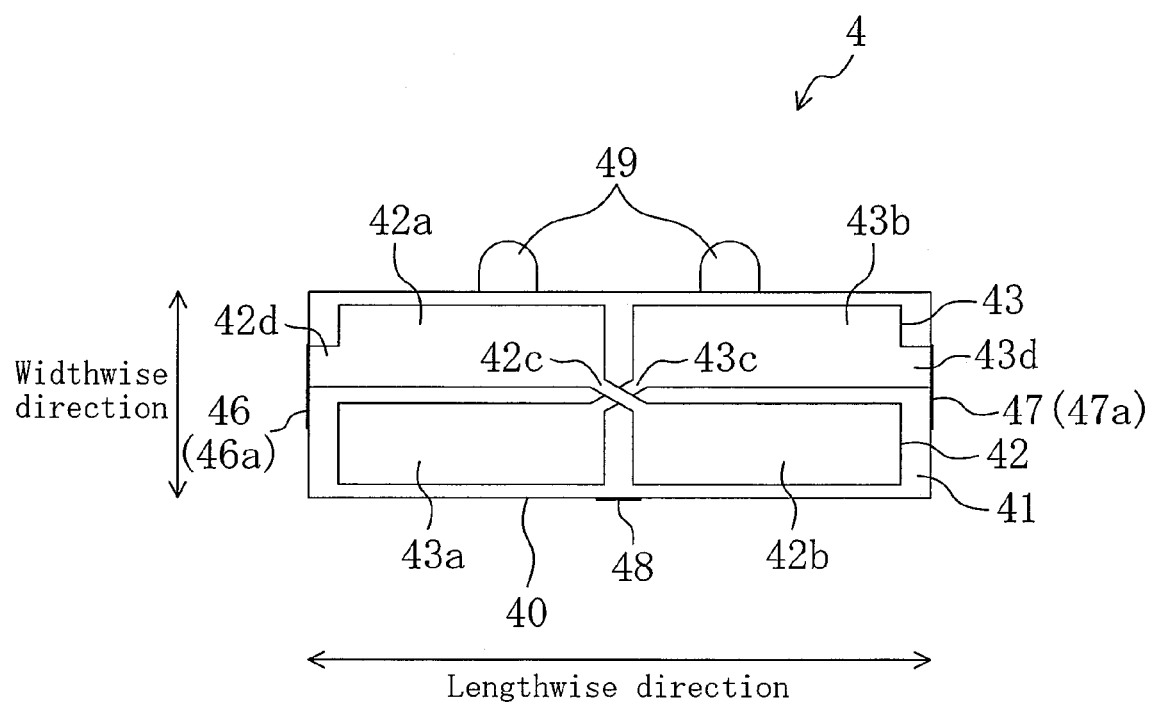
FIG. 5 is a schematic front view illustrating the schematic structure of an actuator body.

Suppose that the principle surface of the piezoelectric layer 41 is divided into quadrants, i.e., two areas in the lengthwise direction and two areas in the widthwise direction. The first positive electrode layer 42 includes a pair of first electrodes 42a and 42b respectively formed on one of the pairs of diagonally aligned areas of the principle surface of the corresponding piezoelectric layer 41. A conductive electrode 42c connects the first electrodes 42a and 42b to bring them into conduction as shown in FIG. 5. The first electrodes 42a and 42b are each a substantially rectangular electrode that overlaps the common negative electrode layer 44 when viewed in the stacking direction. That is, the first electrode 42a (42b) is opposed to the common negative electrode layer 44 with the piezoelectric layer 41 interposed therebetween. One of the first electrodes 42a and 42b, i.e., the first electrode 42a, is provided with a lead electrode 42d extending to the external electrode 46a of the piezoelectric layer 41.

The second positive electrode layer 43 includes a pair of second electrodes 43a and 43b respectively formed on the other pair of diagonally aligned areas of the piezoelectric surface of the corresponding piezoelectric layer 41. A conductive electrode 43c connects the second electrodes 43a and 43b to bring them into conduction. As viewed in the stacking direction represented schematically in FIG. 5, the second electrode 43a is provided to be adjacent to the first electrode 42a in the widthwise direction and adjacent to the first electrode 42b in the lengthwise direction. Similarly, the second electrode 43b is provided to be adjacent to the first electrode 42a in the lengthwise direction and adjacent to the first electrode 42b in the widthwise direction. The second electrodes 43a and 43b are each a substantially rectangular electrode that overlaps the common negative electrode layer 44 when viewed in the stacking direction. That is, the second electrode 43a (43b) is opposed to the common negative electrode layer 44 with the piezoelectric layer 41 interposed therebetween. One of the second electrodes 43a and 43b, i.e., the second electrode 43b, is provided with a lead electrode 43d extending to the external electrode 47a of the piezoelectric layer 41.

In the piezoelectric element unit 40 provided by alternately stacking the piezoelectric layers 41 and the internal electrode layers 42, 44, 43 and 44, the external electrodes 48a of the piezoelectric layers 41 are aligned in the stacking direction in the middle of one of the long side surfaces of the piezoelectric element unit 40 in the lengthwise direction to function as a single external electrode 48. The lead electrodes 44d of the common negative electrode layers 44 are electrically connected to the external electrode 48. Likewise, the external electrodes 46a of the piezoelectric layers 41 are aligned in the stacking direction in the middle of one of the short side surfaces of the piezoelectric element unit 40 in the widthwise direction to function as a single external electrode 46. The lead electrode 42d of the first positive electrode layer 42 is electrically connected to the external electrode 46. Further, the external electrodes 47a of the piezoelectric layers 41 are aligned in the stacking direction in the middle of the other short side surface of the piezoelectric element unit 40 in the widthwise direction to function as a single external electrode 47. The lead electrode 43d of the second positive electrode layer 43 is electrically connected to the external electrode 47.

On the other long side surface of the piezoelectric element unit 40, i.e., the long side surface where the external electrode 48 is not formed, the driver elements 49 are preferably arranged at an interval from each other in the lengthwise direction. The driver elements 49 are arranged at positions inside from the ends of the long side surface in the lengthwise direction by 30 to 35% of the total length of the long side surface. The positions are the antinodes of the second mode of bending vibration of the piezoelectric element unit 40 described later, i.e., positions at which the maximum vibration occurs. The driver elements 49 are columnar elements, at least part of which in contact with the stage 11 has a circular section (specifically, a combination of a columnar element having a semicircle section and a columnar element having a rectangular section), and made of hard material such as ceramic. The driver elements 49 are arranged such that the lengthwise direction of the driver elements 49 is parallel to the thickness direction (stacking direction) of the piezoelectric element unit 40 and the center of the driver elements 49 in the lengthwise direction is aligned with the center of the piezoelectric element unit 40 in the thickness direction.

With the external electrode 48 connected to electrical ground, an AC voltage of a predetermined frequency is applied to the external electrode 46, while an AC voltage having a phase shifted by 90° relative to that of the former AC voltage is applied to the external electrode 47. Accordingly, the AC voltage is applied to the pair of first electrodes 42*a* and 42*b* arranged along the diagonal line of the principle surface of the piezoelectric layer 41 and the AC voltage having a phase shifted by 90° from that of the former AC voltage is applied to the pair of second electrodes 43*a* and 43*b* arranged along the other diagonal line of the principle surface of the piezoelectric layer 41. This induces longitudinal vibration in the lengthwise direction (so-called stretching vibration) and bending vibration in the widthwise direction (so-called transverse vibration) of the piezoelectric element unit 40, i.e., the actuator body 4.

Figure 6:
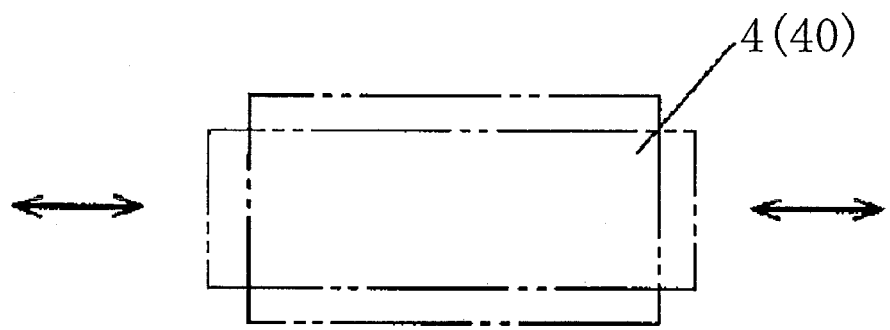
FIG. 6 is a conceptual diagram illustrating the displacement of the actuator body in the first mode of longitudinal vibration in the lengthwise direction.
Figure 7:
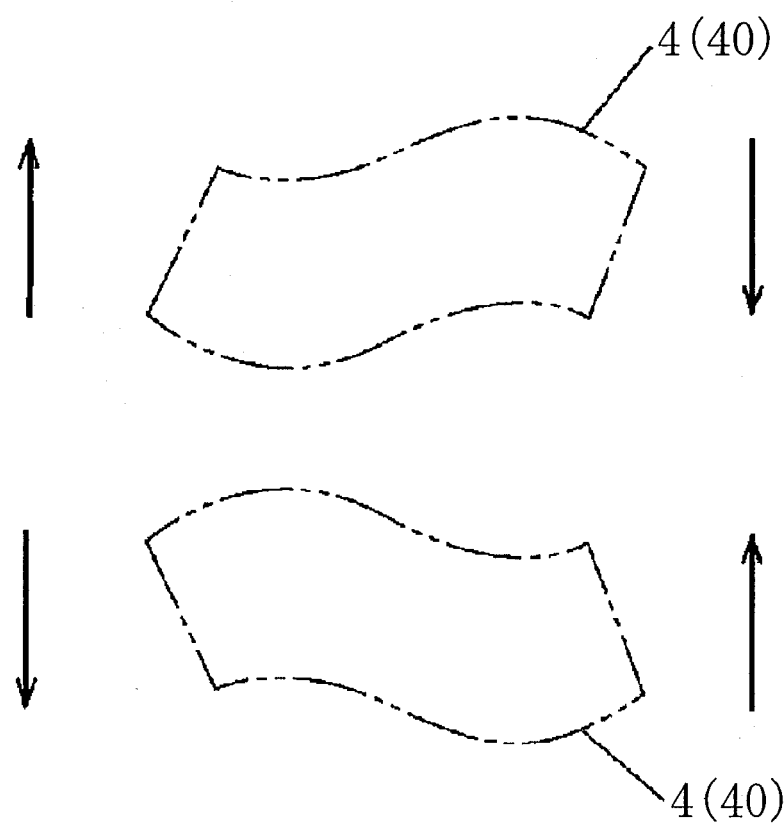
FIG. 7 is a conceptual diagram illustrating the displacement of the actuator body in the second mode of bending vibration.
Figure 8A:
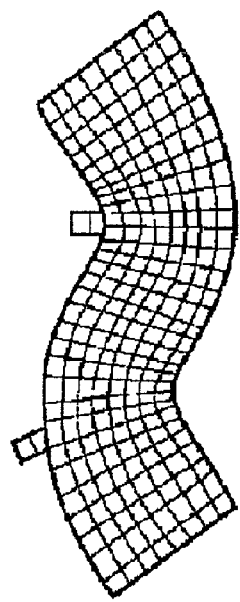
FIGS. 8A to 8D are conceptual diagrams illustrating the movement of the actuator body.
Figure 8B:
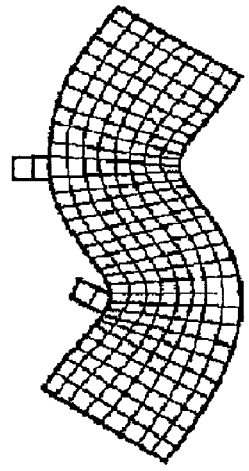
Figure 8C:
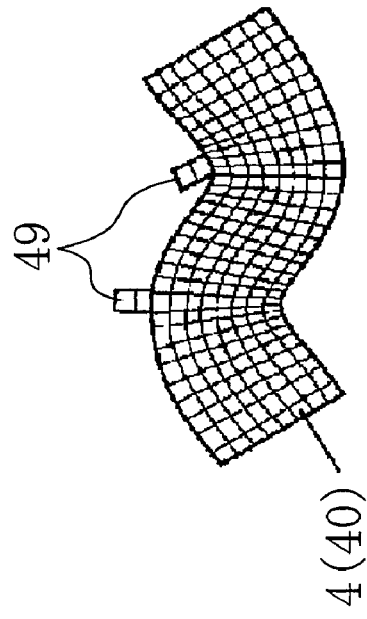
Figure 8D:
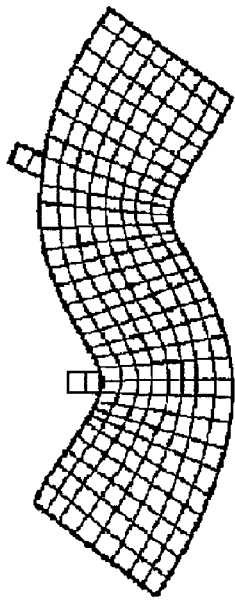

Resonance frequencies of the longitudinal vibration and the bending vibration are determined by the material and the shape of the actuator body 4, i.e., those of the piezoelectric element unit 40. The resonance frequencies are also varied depending on the force supporting the actuator body 4 and positions at which the actuator body 4 is supported. With these facts in mind, the resonance frequencies are adjusted so as to be substantially equal and AC voltages having a frequency close to the adjusted resonance frequency are applied to the external electrodes 46 and 47, respectively, while the phases of the AC voltages are shifted from each other by 90°. For example, if the shape of the piezoelectric element unit 40 is designed such that the first mode of longitudinal vibration (see FIG. 6) and the second mode of bending vibration (see FIG. 7) have the same resonance frequency and the AC voltages having a frequency close to the resonance frequency are applied with their phases shifted from each other by 90° as described above, the first mode of longitudinal vibration and the second mode of bending vibration occur in harmony in the piezoelectric element unit 40. Thus, the shape of the piezoelectric element unit 40 is varied in the order shown in FIGS. 8A to 8D.

As a result, the driver elements 49 of the piezoelectric element unit 40 make a substantially elliptical motion, i.e., circular motion, on a plane parallel to the principle surface of the piezoelectric element unit 40, i.e., a plane including the lengthwise direction and the widthwise direction (a plane parallel to the page surface in FIG. 8).

The case 5 is made of a resin and substantially in the form of a rectangular parallelepiped box corresponding to the shape of the piezoelectric element unit 40. The case 5 has a substantially rectangular main wall 51 parallel to the principle surface of the piezoelectric element unit 40, a first short side wall 52 provided on one short side of the main wall 51 at one end of the main wall 51 in the lengthwise direction (the left short side in FIG. 3), a second short side wall 53 provided on the other short side of the main wall 51 at the other end of the main wall 51 in the lengthwise direction (the right short side in FIG. 3) and a long side wall 54 provided on one long side of the main wall 51 at one end of the main wall 51 in the widthwise direction (the lower long side in FIG. 3). Specifically, the case 5 does not have a wall opposite the main wall 51 and a wall on the other long side of the main wall 51 at the other end of the main wall 51 in the widthwise direction (the upper long side of FIG. 3), i.e., a wall corresponding to the long side surface of the piezoelectric element unit 40 on which the driver elements 49 are formed. The case 5 is opened at a plane perpendicular to the thickness direction of the piezoelectric element unit 40 (normal direction of the main wall 51) and a plane at the other end of the main wall in the widthwise direction.

The actuator body 4 is contained in the thus-configured case 5. The actuator body 4 is placed in the case 5 such that one of the principle surfaces of the piezoelectric element unit 40 faces the main wall 51 and one of the long side surfaces of the piezoelectric element unit 40 (the long side surface on which the external electrode 48 is formed) faces the long side wall 54. The driver elements 49 protrude from the case 5 toward the other end in the widthwise direction. One of the support rubbers 61 is interposed between one of the short side surfaces of the piezoelectric element unit 40 and the first short side wall 52 of the case 5 and the other support rubber 61 is interposed between the other short side surface of the piezoelectric element unit 40 and the second short side wall 53 of the case 5.

The short side surfaces of the piezoelectric element unit 40 are antinodes of the longitudinal vibration. Since the support rubbers 61 are elastic bodies, they can support the piezoelectric element unit 40 without hindering the longitudinal vibration of the piezoelectric element unit 40. The support rubbers 61 are in contact with not only the actuator body 4 and the first and second short side walls 52 and 53 but also the inner surface of the main wall 51. The bias rubber 62 is provided between one of the long side surfaces of the piezoelectric element unit 40 and the long side wall 54 of the case 5. The bias rubber 62 is in contact with not only the actuator body 4 and the long side wall 54 but also the inner surface of the main wall 51.

Electrodes 51*a* are formed on parts of the inner surface of the main wall 51 in contact with the support rubbers 61 and the bias rubber 62 (only one electrode in contact with the bias rubber 62 is shown in the figure). These electrodes are in conduction with terminal electrodes (not shown) formed on the outer surface of the main wall 51, respectively.

Each of the support rubbers 61 is substantially in the form of a rectangular parallelepiped and made of electrically conductive rubber prepared by mixing metal particles in silicone rubber. The support rubbers 61 elastically support the actuator body 4 and bias the actuator body 4 in the lengthwise direction of the actuator body 4. At the same time, the support rubbers 61 bring the external electrodes 46 and 47 of the piezoelectric element unit 40 into electrical conduction with the electrodes formed on the parts of the inner surface of the main wall 51 on the short sides thereof in electrical conduction with the terminal electrodes.

Just like the support rubbers 61, the bias rubber 62 is substantially in the form of a rectangular parallelepiped and made of electrically conductive rubber prepared by mixing metal particles in silicone rubber. The bias rubber 62 is adapted to bias the actuator body 4 in the widthwise direction of the actuator body 4 (the biasing direction is the widthwise direction). At the same time, the bias rubber 62 brings the external electrode 48 of the piezoelectric element unit 40 and the electrode 51*a* of the main wall 51 into electrical conduction.

With this configuration, feeding to the piezoelectric element unit 40 is achieved by feeding to the terminal electrodes formed on the outer surface of the case 5.

In the thus-configured ultrasonic actuator 2, the driver elements 49 are brought into contact with the bottom surface of the stage 11 and the case 5 is fixed to the base (not shown). To be more specific, the ultrasonic actuator 2 is arranged such that the widthwise direction of the piezoelectric element unit 40 is orthogonal to the bottom surface of the stage 11 and the lengthwise direction of the piezoelectric element unit 40 is parallel to the bottom surface of the stage 11 and the guides 13. In other words, the ultrasonic actuator 2 is arranged such that the direction of the bending vibration of the piezoelectric element unit 40 is orthogonal to the bottom surface of the stage 11 and the direction of the longitudinal vibration of the piezoelectric element unit 40 is parallel to the guides 13.

At the same time, the bias rubber 62 is compressed and deformed and the driver elements 49 are biased toward the stage 11 by the elastic force of the bias rubber 62. The biasing force of the ultrasonic actuator 2 on the stage 11 is determined by the elastic force of the bias rubber 62.

As shown in FIG. 1, the rear surface of the stage 11 (the bottom surface in the present embodiment) includes an undulating surface 12 in contact with the driver elements 49. The undulating surface 12 includes concavities 12a and convexities 12b formed alternately at a certain pitch along the moving direction of the stage 11, and having the same width which is larger than the interval between the driver elements 49. Therefore, both the driver elements 49 may contact with the same concavity 12a or the same convexity 12b at the same time.

Figure 9:
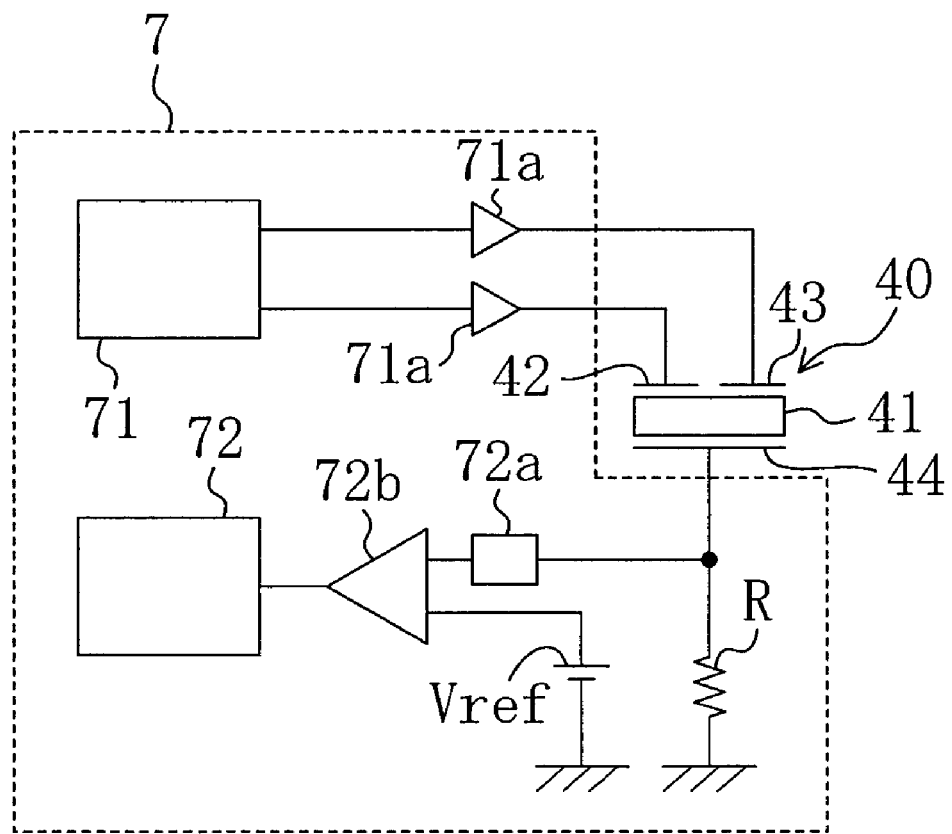
FIG. 9 is a block diagram illustrating the structure of a control unit.

Referring to FIG. 9, the control unit 7 includes a driver 71 for driving the ultrasonic actuator 2 and a current change detector 72 for detecting a change in current flowing through the actuator body 4. The control unit 7 receives an externally applied operation command and applies AC voltages having a frequency corresponding to the operation command to the external electrodes 46 and 47 with their phases shifted from each other in accordance with the operation command. The control unit 7 functions as a control section.

The control unit 7 may be a CPU or a drive circuit and outputs two electrical signals having a predetermined frequency and phases different from each other. The two electrical signals are input to amplifiers 71a driven by a constant-voltage power supply (not shown). The two AC voltages as amplified up to a predetermined voltage value by these amplifiers 71a are applied to the first and second positive electrode layers 42 and 43 through the external electrodes 46 and 47 of the piezoelectric element unit 40. At this time, for the purpose of preventing abnormal heat generation by the piezoelectric element unit 40, the frequency of the AC voltages is set to an antiresonance frequency which is slightly higher than a common resonance frequency of longitudinal and bending vibrations of the piezoelectric element unit 40.

When the two AC voltages of different phases are applied, the actuator body 4, i.e., the piezoelectric element unit 40, generates the longitudinal and bending vibrations in harmony and the driver elements 49 make a substantially elliptical motion on the plane including the lengthwise and widthwise directions of the piezoelectric element unit 40. As a result, the driver elements 49 periodically come in and out of contact with the stage 11 to apply a driving force to the stage 11 in the lengthwise direction of the piezoelectric element unit 40 by friction. Therefore, the stage 11 moves along the guides 13. Depending on the degree of the circular motion, the driver elements 49 do not come out of contact with the stage 11 but repeatedly increase and decrease the friction against the stage 11. The lengthwise direction of the piezoelectric element unit 40 (the extending direction of the guides 13) corresponds to the driving direction in which the driver elements 49 outputs the driving force.

Figure 10A:
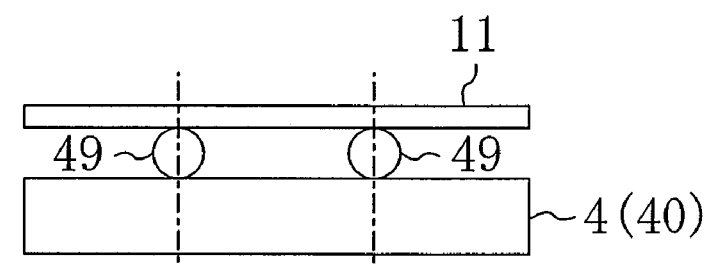
FIGS. 10A to 10C are conceptual diagrams illustrating how a stage is driven by the ultrasonic actuator.
Figure 10B:
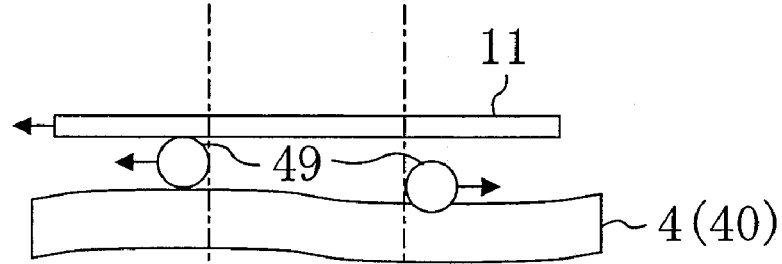

Specifically, when the piezoelectric element unit 40 stretches in the lengthwise direction (the direction of the longitudinal vibration), one of the driver elements 49 (e.g., the left one in FIG. 10) moves in the lengthwise direction to pass closer to the stage 11 than to the piezoelectric element unit 40 in the widthwise direction (the direction of the bending vibration) as shown in FIG. 10B and applies increased friction against the stage 11. With this friction, the stage 11 is displaced toward the moving direction of the one of the driver elements 49 in the lengthwise direction (e.g., to the left in FIG. 10). At the same time, the other driver element 49 (e.g., the right one in FIG. 10) moves in the lengthwise direction opposite from the moving direction of the former driver element 49 to pass closer to the piezoelectric element unit 40 than to the stage 11 in the widthwise direction (to be spaced from the stage 11). Therefore, the friction between the driver element 49 and the stage 11 is reduced or zero. Thus, the latter driver element 49 has little influence on the displacement of the stage 11.

Figure 10C:
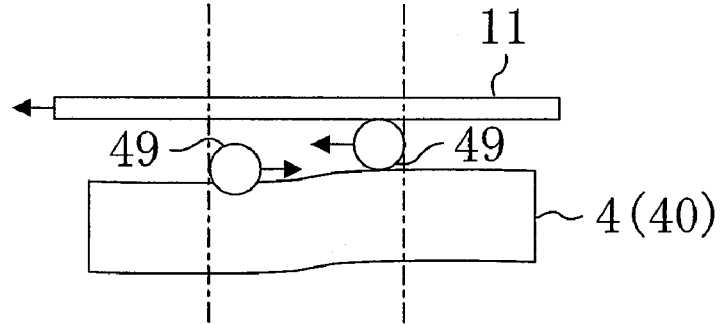

In the case where the piezoelectric element unit 40 contracts in the lengthwise direction, the latter driver element 49 (e.g., the right one in FIG. 10) moves in the lengthwise direction to pass closer to the stage 11 than to the piezoelectric element unit 40 in the widthwise direction as shown in FIG. 10C and applies increased friction against the stage 11. With this friction, the stage 11 is displaced toward the moving direction of the latter driver element 49 in the lengthwise direction (e.g., to the left in FIG. 10). At the same time, the former driver element 49 (e.g., the left one in FIG. 10) moves in the lengthwise direction opposite from the moving direction of the latter driver element 49 to pass closer to the piezoelectric element unit 40 than to the stage 11 in the widthwise direction. Therefore, the friction between the former driver element 49 and the stage 11 is reduced or zero. Thus, the former driver element 49 has little influence on the displacement of the stage 11. The direction of the displacement in this case is the same as the moving direction of the stage 11 driven by the former driver element 49 when the piezoelectric element unit 40 is stretched.

In this manner, the two driver elements 49 alternately allow the stage 11 to move in the same direction while their phases are shifted from each other by 180°. If the AC voltages with their phases shifted from each other by −90° are applied to the external electrodes 46 and 47, the driver elements 49 deliver the driving force in the opposite direction such that the stage 11 moves in the opposite direction.

The travel distance, traveling speed and traveling acceleration of the stage 11 are adjusted by controlling at least one of the voltage value, the frequency and the feeding period of the AC voltages applied to the external electrodes 46 and 47. Alternately, the adjustment is carried out by changing the value of phase difference between the AC voltages applied to the external electrodes 46 and 47.

Based on the detection of the change in current flowing through the piezoelectric element unit 40 by the current change detector 72 as discussed in more detail below, the control unit 7 is configured to estimate the travel distance of the stage 11 and thereby detect the position of the stage 11. Based thereon, the control unit 7 is able to perform feedback control of the travel distance of the stage 11, i.e., the position of the stage 11.

Specifically, the piezoelectric element unit 40 of the ultrasonic actuator 2 for driving the stage 11 is biased toward the stage 11 by the bias rubber 62 and contact pressure is exerted on the driver elements 49. As the stage 11 is provided with the undulating surface 12 engaged by the drive elements 49, the contact pressure on the driver elements 49 varies as the driver elements 49 make a circular motion while they repeatedly come in and out of contact with the stage 11. In other words, the contact pressure on the driver elements 49 is relatively low when the driver elements 49 are in contact with a concavity 12a of the stage 11, while it is relatively high when the driver elements 49 are in contact with a convexity 12b of the stage 11.

Figure 11:
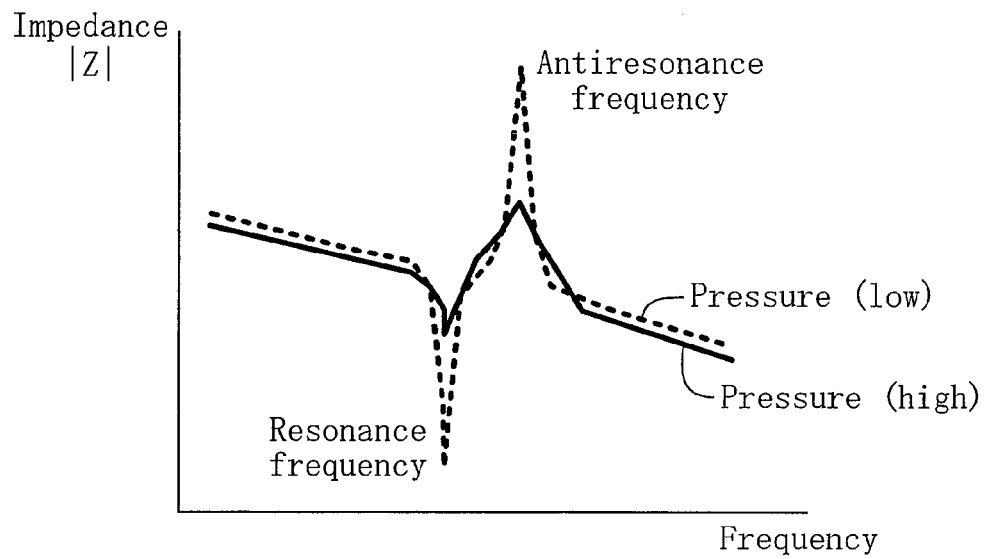
FIG. 11 is a graph illustrating relationship between driving frequency and impedance of the piezoelectric element unit.

As the contact pressure is exerted on the driver elements 49 in this manner, the piezoelectric element unit 40 on which the driver elements 49 are provided incurs pressure. That is, the pressure applied to the piezoelectric element unit 40 varies as the contact pressure on the driver elements 49 varies with the undulations. Therefore, as shown in FIG. 11, the impedance of the piezoelectric element unit 40 also varies in response to the change in pressure applied to the piezoelectric element unit 40. For example, in the present embodiment, the ultrasonic actuator 2 is operated by the AC voltages having a frequency close to the antiresonance frequency. The impedance of the piezoelectric element unit 40 at the antiresonance frequency becomes higher as the pressure applied to the piezoelectric element unit 40 is lower, or it becomes lower as the pressure is higher. If such relationship or similar relationship between the pressure and the impedance is known in advance, the change in pressure applied to the piezoelectric element unit 40 or the change in contact pressure on the driver elements 49 may be detected by detecting the change in impedance of the piezoelectric element unit 40.

For example, the control unit 7 drives the piezoelectric element unit 40 by a constant-voltage drive circuit as described above. At the same time, the current change detector 72 of the control unit 7 is configured to detect the change in current flowing through a detection resistance R connected in series between the common negative electrode layer 44 of the piezoelectric element unit 40 and electrical ground. As the change in current through the resistance R is related to a change in impedance, the current change detector 72 is thereby able to detect the change in impedance of the piezoelectric element unit 40. Based on the change in impedance, which is a function of the change in contact pressure exerted on the driver elements 49 by the undulating surface 12, the travel distance of the stage 11 may be estimated by the control unit 7 to detect the position of the stage 11.

More specifically, the current change detector 72 detects the change in current flowing through the detection resistance R by extracting a DC component of a detection resistance voltage of the detection resistance R connected in series between the external electrode 48 of the common negative electrode layers 44 and ground. For example, the DC component is extracted using a detector (e.g., a DC voltage tap) 72a and amplifying the difference between the DC component and a reference voltage Vref using the amplifier 72b.

Figure 12:
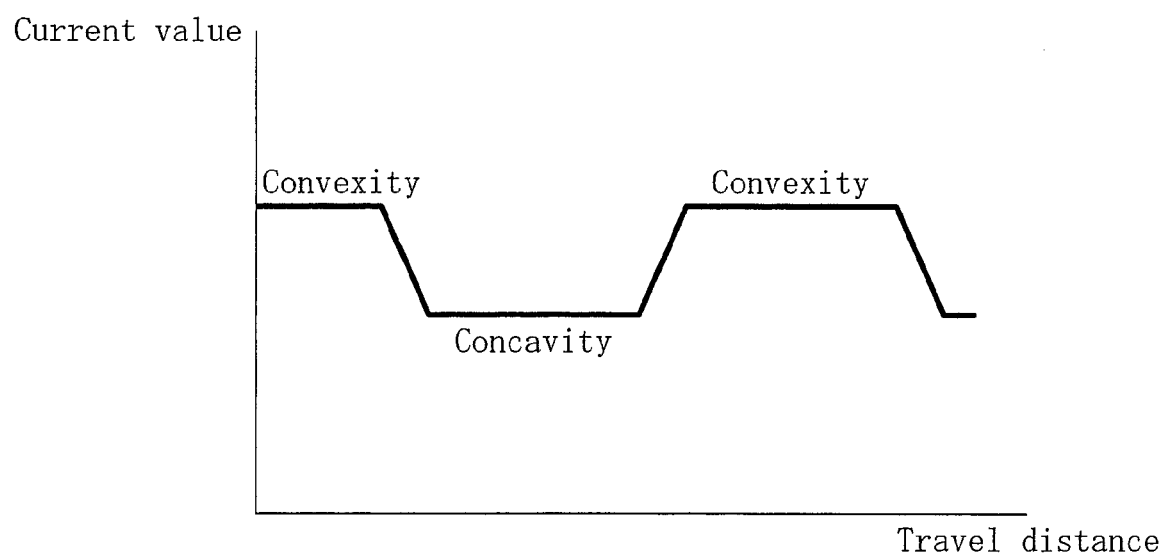
FIG. 12 is a graph illustrating relationship between a travel distance of the stage and a current value detected by a current detector.
Figure 13:
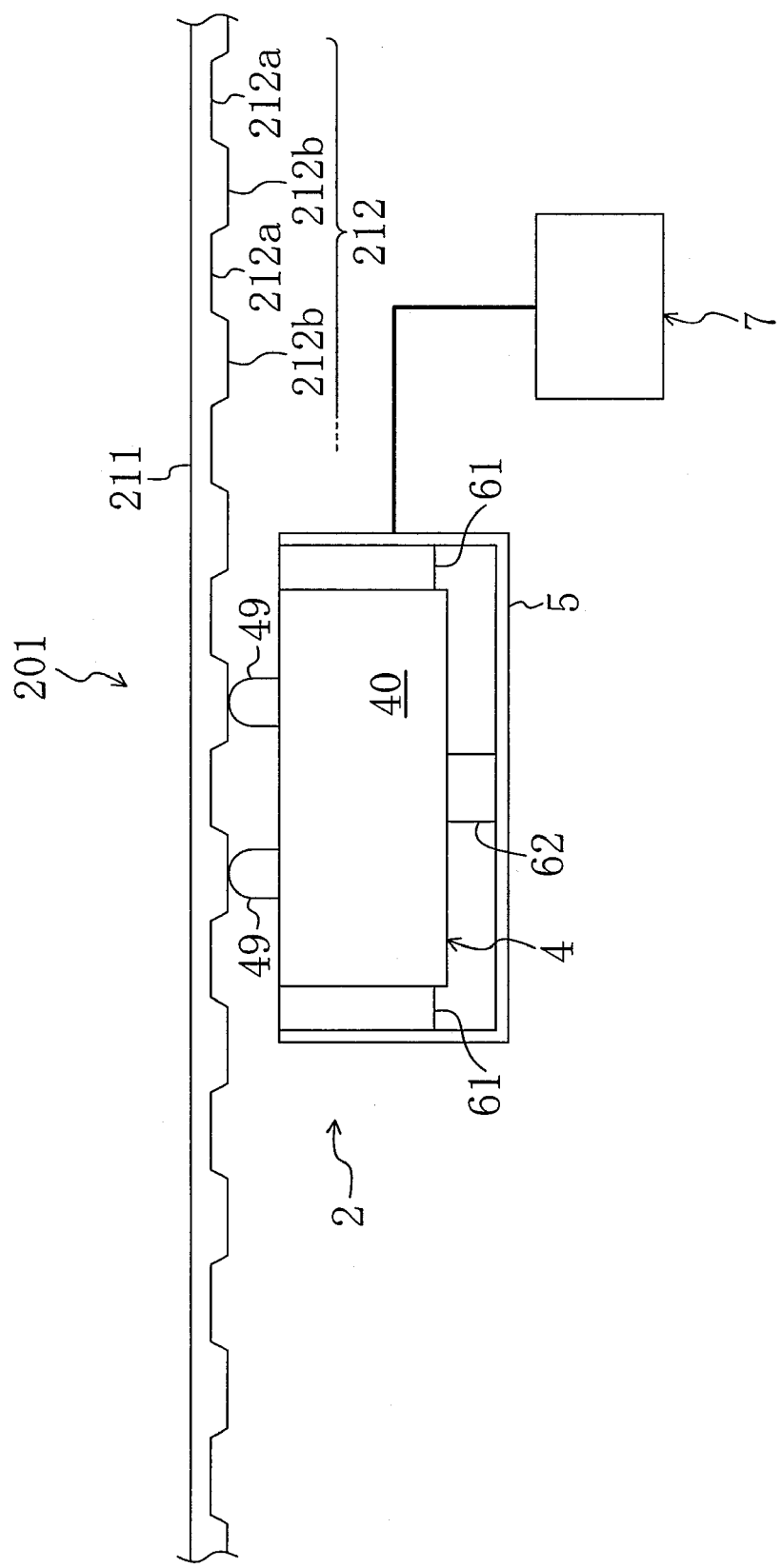
FIG. 13 is a schematic front view of a drive unit according to Embodiment 2.

The current detected by the current change detector 72 varies as shown in FIG. 12 in accordance with the undulation cycle in the undulating surface 12 of the stage 11. To be more specific, when the driver elements 49 are in contact with a concavity 12a of the stage 11, the pressure applied to the piezoelectric element unit 40 is reduced, the impedance increases and the current decreases. On the other hand, when the driver elements 49 are in contact with the convexity 12b of the stage 11, the pressure applied to the piezoelectric element unit 40 increases, the impedance decreases and the current increases. If one of the driver elements 49 is in contact with the concavity 12a and the other driver element 49 is in contact with the convexity 12b, the current value lies between the current detected when both of the driver elements 49 are in contact with the concavity 12a and the current detected when both driver elements 49 are in contact with the convexity 12b. In this manner, the current detected by the current change detector 72 varies in accordance with the pitch of the concavities 12a and the convexities 12b in the undulating surface 12. Therefore, based on the change in current, whether both of the driver elements 49 are in contact with the concavity 12a or the convexity 12b, or the two driver elements 49 are separately in contact with the concavity 12a and the convexity 12b is estimated. The travel distance of the stage 11 may then be estimated within the control unit 7 based on the number of cycles of current changes that are detected and the known pitch of the undulations. As the travel distance of the stage 11 is estimated, the control unit 7 is configured to determine the position of the stage 11 based on a previously known start position of the stage 11 and the estimated travel distance. If only relation position is needed, the position may be determined based simply on the estimated travel distance.

As the pressure applied to the piezoelectric element unit 40 varies generally sinusoidally, the current corresponding varies in the generally sinusoidal manner. If the number of cycles or the change in sinusoidal waves is supplemented for estimation, the travel distance of the stage 11 is estimated with higher precision than that of the estimation based on the pitch of the concavities 12a and the convexities 12b.

Due to the relationship between the contact pressure on the driver elements 49 and the impedance of the piezoelectric element unit 40, the control unit 7 of the present embodiment is able to estimate the change in contact pressure on the driver elements 49 by detecting the change in current (DC component) flowing through the detection resistance R. However, the present invention is not limited thereto. For example, a magnitude of the current flowing through the detection resistance R and a phase difference between the current and voltage also vary as the pressure applied to the piezoelectric element unit 40 varies the complex impedance of the piezoelectric element unit 40. Therefore, the change in contact pressure on the driver elements 49 can also be estimated based on the magnitude of the current or the phase difference between the current and the voltage.

According to Embodiment 1, the current flowing through the detection resistance R is detected to recognize the change in impedance of the piezoelectric element unit 40 and thereby the change in contact pressure on the driver elements 49. Then, from the change in contact pressure on the driver elements 49 and the known pitch of the undulations causing such change in contact pressure, the control unit 7 is able to estimate the travel distance of the stage 11 and the position of the stage 11 may be determined. That is, the position of the stage 11 is detected merely by the detection of the electrical signal from the piezoelectric element unit 40. This eliminates the need of providing an additional sensor for detecting the position of the stage. Thus, the detection of the position of the stage 11 is achieved by a simple configuration.

As the width of the concavities 12a and the convexities 12b is set larger than the interval between the two driver elements 49, the two driver elements 49 simultaneously come into contact with the same concavity 12a or the same convexity 12b. Therefore, the change in contact pressure on the driver elements 49 is clearly presented as the change in current flowing through the detection resistance R. To be more specific, the pressure exerted on the piezoelectric element unit 40 is minimized when the two driver elements 49 are simultaneously located at the concavity 12a and is maximized when the two driver elements 49 are simultaneously located at the convexity 12b. In such a configuration that the driver elements will never be located at the concavity 12a or the convexity 12a simultaneously, one of the driver elements is always situated at the concavity 12a when the other driver element is situated at the convexity 12b. In this case, the pressure exerted on the piezoelectric element unit 40 is not reduced as low as the pressure exerted when the two driver elements are simultaneously in contact with the concavity 12a. Similarly, the pressure exerted on the piezoelectric element unit 40 is not increased as high as the pressure when the two driver elements are simultaneously in contact with the convexity 12b. Therefore, in the present embodiment, the peak-to-peak value of the current is increased because the two driver elements are configured to be simultaneously located at the concavity 12a or the convexity 12b.

Thus, the position of the stage 11 is detected with precision.

In order to bring the two driver elements simultaneously at the concavity or the convexity, the driver elements, the concavity and the convexity are configured to meet any one of the conditions of (i) the width of the concavity 12a is larger than the interval between the driver elements 49, (ii) the width of the convexity 12b is larger than the interval between the driver elements 49 and (iii) the width of the concavity 12a and that of the convexity 12b are equal and different from the interval between the driver elements 49.

Further, if at least part of the driver elements 49 in contact with the stage 11 is curved, the driver elements 49 and the stage 11 are brought into linear contact (point contact when the driver elements 49 are spherical). Thus, the position of the stage 11 is detected with high precision.

Embodiment 2

Figure 14:
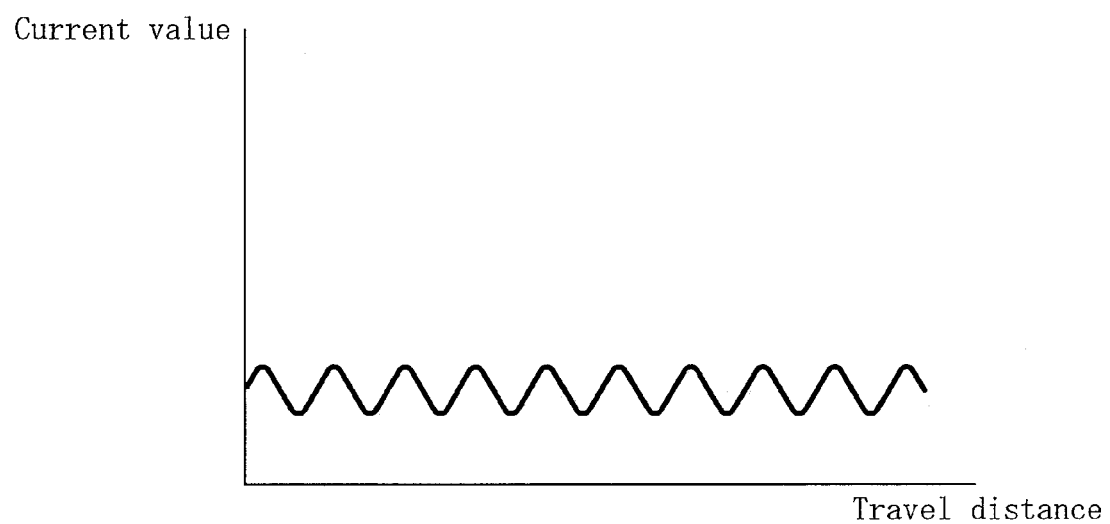
FIG. 14 is a graph illustrating relationship between a travel distance of the stage and a current value detected by a current detector according to Embodiment 2.

Referring to FIG. 14, a drive unit 201 according to Embodiment 2 of the present invention will be described.

The drive unit 201 of Embodiment 2 is the same as that of Embodiment 1 except the configuration of an undulating surface 212 formed on a stage 211. The same components as those described in Embodiment 1 will be indicated by the same reference numerals to omit detailed explanation.

Specifically, the rear surface of the stage 211 of the drive unit 201 is provided with the undulating surface 212 as shown in FIG. 14. The undulating surface 212 include concavities 212a and convexities 212b formed alternately at a certain pitch along the moving direction of the stage 211 and have the same width which is smaller than the interval between the two driver elements 49 and larger than the width of each of the driver elements 49. That is, the driver elements 49 will not be in contact with the same concavity 212a or the same convexity 212b at the same time.

Even if the width of the concavities 212a and the convexities 212b is smaller than the interval between the two driver elements 49, the driver elements 49 come into contact with the concavities 212a or the convexities 212b as they move the stage 211 as shown in FIG. 14. Therefore, the contact pressure exerted on the driver elements 49 varies. As a result, the impedance of the piezoelectric element unit 40 varies and the current flowing through the detection resistance R varies periodically as illustrated in FIG. 14. The cyclical the change in current corresponds to the pitch of the concavities 212a and the convexities 212b of the stage 211.

Thus, according to Embodiment 2, again the change in contact pressure on the driver elements 49 due to the concavities 212a and the convexities 212b is detected from the change in current flowing through the detection resistance R. The control unit 7 may then estimate the travel distance and the position of the stage 211 based on the detected changes and the known pitch of the undulations.

Embodiment 3

Figure 15:
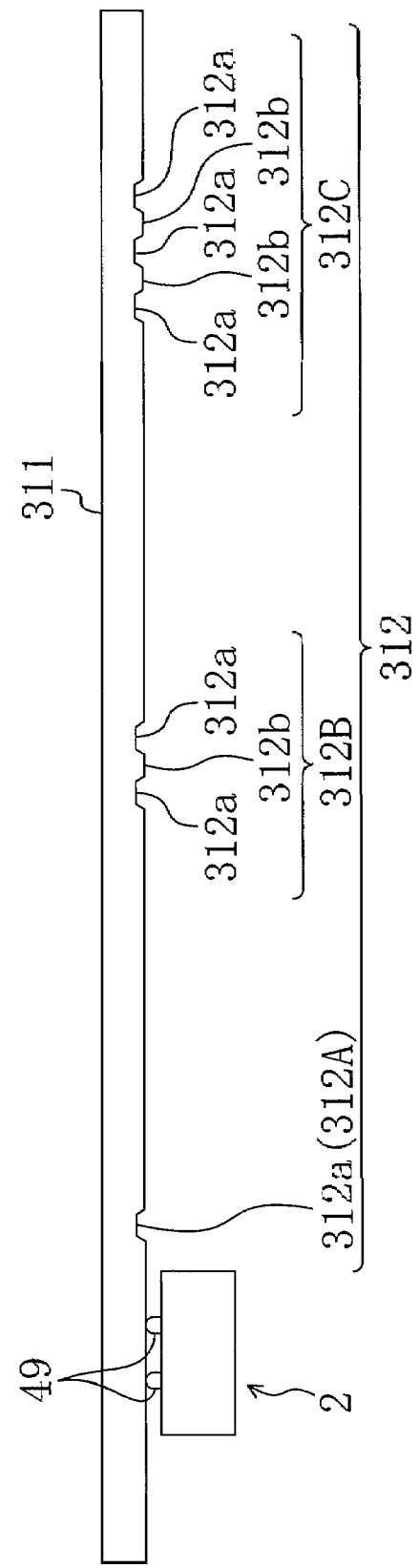
FIG. 15 is a schematic front view of a drive unit according to Embodiment 3.

Referring to FIG. 15, a drive unit 301 according to Embodiment 3 of the present invention will be described.

The drive unit 301 of Embodiment 3 is the same as that of Embodiment 1 except the configuration of an undulating surface 312 formed on a stage 311. The same components as those described in Embodiment 1 will be indicated by the same reference numerals to omit detailed explanation.

The rear surface of the stage 311 of the drive unit 301 is provided with the undulating surface 312 as shown in FIG. 15. The undulating surface 312 includes undulations of certain unique patterns formed on the stage 311 at certain positions in the moving direction of the stage 311.

Specifically, a first undulation 312A, a second undulation 312B and a third undulation 312C are formed in first, second and third positions in the moving direction of the stage 311, respectively. These first, second and third positions represent absolute positions in that the corresponding pattern is associated with a specific position along the undulating surface 312.

The first undulation 312A includes a single concavity 312a. The second undulation 312B includes alternately arranged two concavities 312a and a single convexity 312b. The third undulation 312C includes alternately arranged three concavities 312a and two convexities 312b.

As described above, the undulations formed in the first, second and third positions have different patterns from each other. Therefore, the pattern of the undulation with which the driver elements 49 are in contact is identified by the current change detector 72 based on how the current flowing through the detection resistance R varies. Therefore, the control unit 7 is able to estimate which particular one of the first, second and third positions the driver elements 49 are located. In other words, the first, second and third undulations 312A, 312B and 312C have the position information corresponding to the first, second and third positions, respectively.

According to Embodiment 3, again the change in contact pressure on the driver elements 49 is detected from the change in current flowing through the detection resistance R. As a result of using unique patterns of undulations, the control unit 7 may estimate directly the position of the stage 311.

The concavities 312a and the convexities 312b have the same width and are arranged at a regular pitch. However, the present invention is not limited thereto. Likewise, it is not always necessary that the first, second and third undulations 312A, 312B and 312C be arranged at a regular pitch (periodically) and instead may be arranged at any desired positional relationship. The patterns of the undulations are not limited to those described in Embodiment 3 as long as the positions of the undulations may be recognized, i.e., the undulations have the position information.

Embodiment 4

Figure 16:
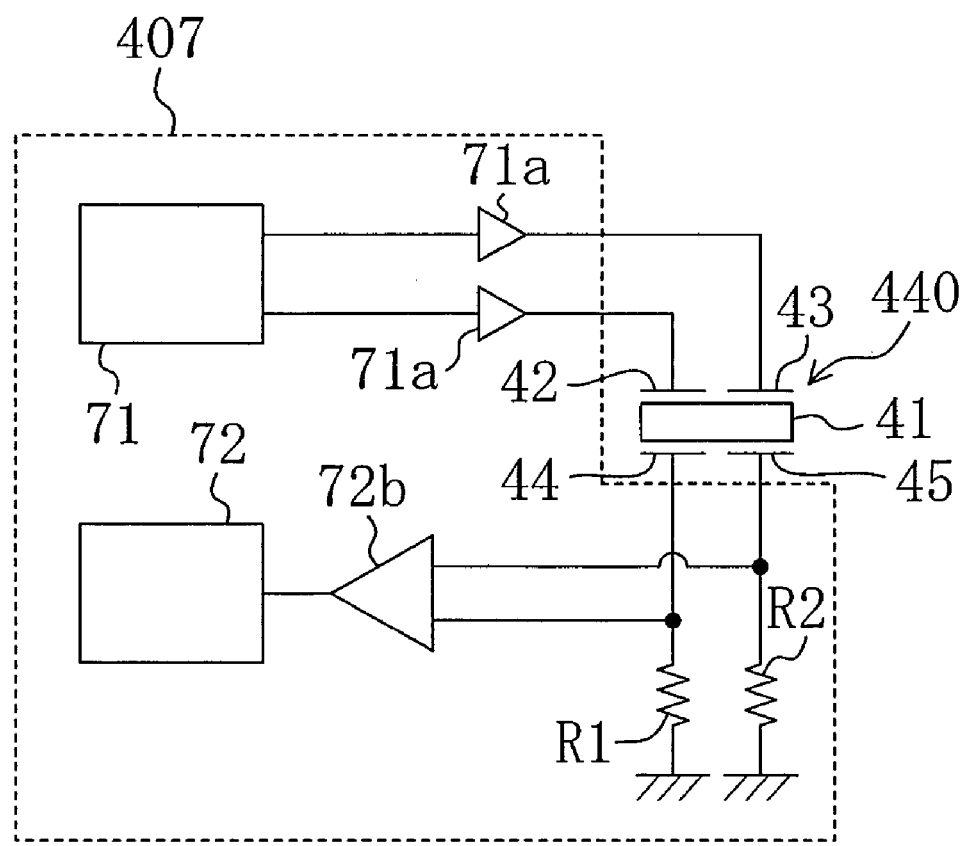
FIG. 16 is a block diagram illustrating the structure of a control unit according to Embodiment 4.
Figure 17:
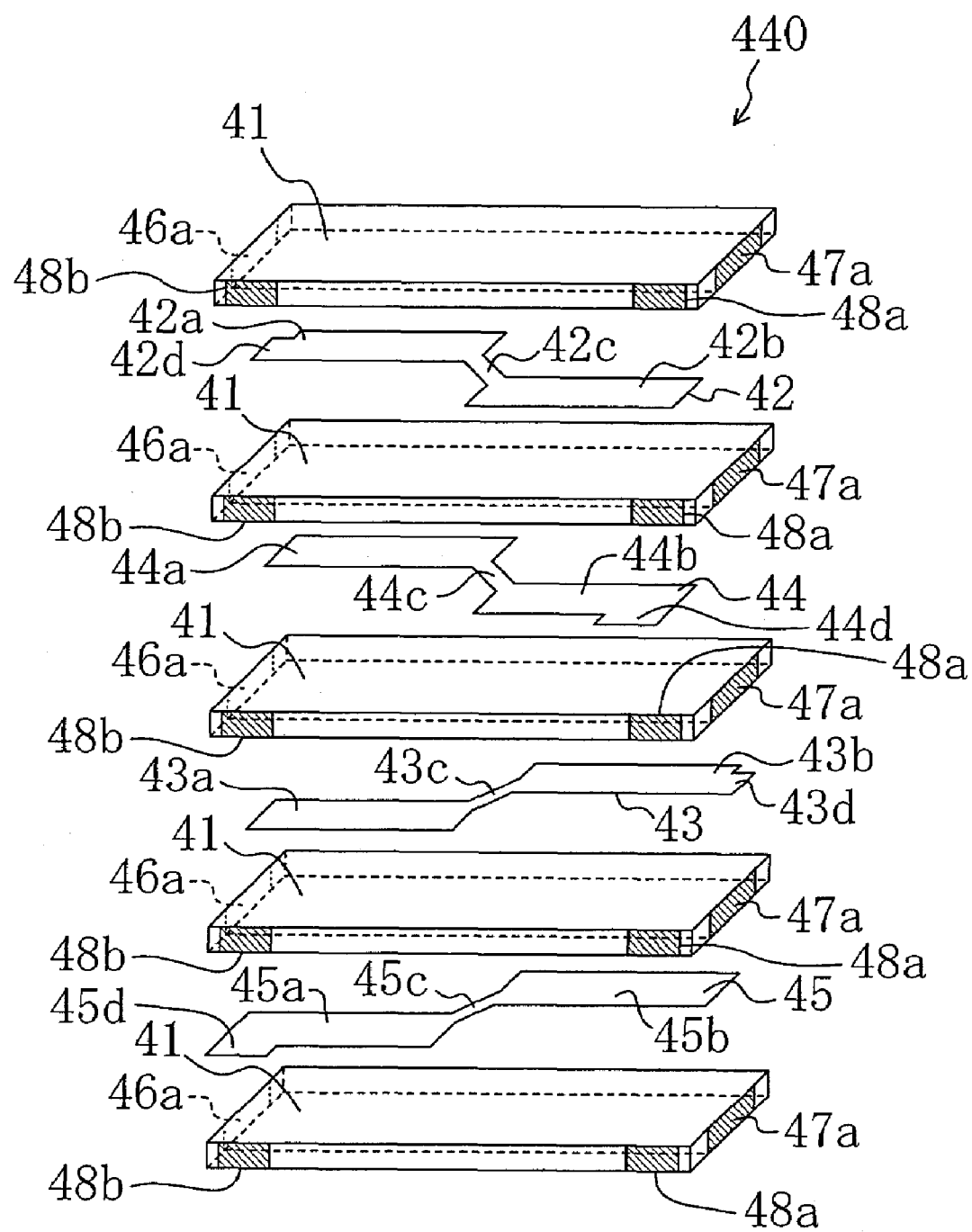
FIG. 17 is an exploded perspective view of a piezoelectric element unit.

Referring to FIGS. 16 and 17, a drive unit 401 according to Embodiment 4 of the present invention will be described.

The drive unit 401 of Embodiment 4 is the same as that of Embodiment 1 except the configuration of internal electrode layers in a piezoelectric element unit 440 and the method for detecting the change in impedance of the piezoelectric element unit 440. The same components as those described in Embodiment 1 will be indicated by the same reference numerals to omit detailed explanation.

The piezoelectric element unit 440 of Embodiment 4 includes a first negative electrode layer 44 and a second negative electrode layer 45 which are electrically disconnected from each other as shown in FIGS. 15 and 16.

Specifically, the piezoelectric element unit 440 is provided by alternately stacking five piezoelectric layers (piezoelectric elements) 41 and four internal electrode layers 42, 44, 43 and 45. The internal electrode layers 42, 44, 43 and 45 are a first positive electrode layer 42, a first negative electrode layer 44, a second positive electrode layer 43 and a second negative electrode layer 45 stacked in this order alternately with the piezoelectric layers 41. The first positive electrode layer 42, the first negative electrode layer 44, the second positive electrode layer 43 and the second negative electrode layers 45 are printed on the principle surfaces of the piezoelectric layers 41, respectively.

Each of the piezoelectric layers 41 is provided with external electrodes 48a and 48b formed at the ends of one of the long side surfaces in the lengthwise direction, an external electrode 46a formed in the middle of one of the short side surfaces in the widthwise direction and an external electrode 47a formed in the middle of the other short side surface in the widthwise direction.

Suppose that the principle surface of the piezoelectric layer 41 is divided into quadrants, i.e., two areas in the lengthwise direction and two areas in the widthwise direction. The first positive electrode layer 42 includes a pair of first electrodes 42a and 42b respectively formed on one of the pairs of diagonally aligned areas of the principle surface of the corresponding piezoelectric layer 41. A conductive electrode 42c connects the first electrodes 42a and 42b to bring them into conduction. The first electrodes 42a and 42b are each a substantially rectangular electrode. The first electrode 42a is provided with a lead electrode 42d extending to the external electrode 46a of the piezoelectric layer 41.

Further, just like the first positive electrode layer 42, the first negative electrode layer 44 includes a pair of first electrodes 44a and 44b formed on one of the pairs of diagonally aligned areas of the principle surface of the corresponding piezoelectric layer 41. A conductive electrode 44c connects the first electrodes 44a and 44b to bring them into electrical conduction. Each of the first electrodes 44a and 44b is a substantially rectangular electrode. The first electrode 44a is provided with a lead electrode 44d extending to the external electrode 48a of the piezoelectric layer 41.

That is, the first positive electrode layer 42 and the first negative electrode layer 44 have the same shape except the lead electrodes 42d and 44d and overlap each other (opposed each other) when viewed in the stacking direction with the piezoelectric layer 41 interposed therebetween.

The second positive electrode layer 43 includes a pair of second electrodes 43a and 43b respectively formed on the other pair of the diagonally aligned areas of the piezoelectric surface of the corresponding piezoelectric layer 41. A conductive electrode 43c connects the second electrodes 43a and 43b to bring them into conduction. As viewed in the stacking direction, the second electrode 43a is provided to be adjacent to the first electrode 42a in the widthwise direction and adjacent to the first electrode 42b in the lengthwise direction. Similarly, the second electrode 43b is provided to be adjacent to the first electrode 42a in the lengthwise direction and adjacent to the first electrode 42b in the widthwise direction. The second electrodes 43a and 43b are each a substantially rectangular electrode. The second electrode 43b is provided with a lead electrode 43d extending to the external electrode 47a of the piezoelectric layer 41.

Just like the second positive electrode layer 43, the second negative electrode layer 45 includes a pair of second electrodes 45a and 45b formed on the other pair of the diagonally aligned areas of the piezoelectric surface of the piezoelectric layer 41 and a conductive electrode 45c for connecting the second electrodes 45a and 45b to bring them into conduction. Each of the second electrodes 45a and 45b is a substantially rectangular electrode. The second electrode 45a is provided with a lead electrode 45d extending to the external electrode 48b of the piezoelectric layer 41.

That is, the second positive electrode layer 43 and the second negative electrode layer 45 have the same shape except the lead electrodes 43d and 45d and overlap each other (opposed each other) when viewed in the stacking direction with the piezoelectric layer 41 interposed therebetween.

In the piezoelectric element unit 440 provided by alternately stacking the piezoelectric layers 41 and the internal electrode layers 42, 44, 43 and 45, the external electrodes 48a and 48b of the piezoelectric layers 41 are aligned in the stacking direction at the ends of one of the long side surfaces of the piezoelectric element unit 40 in the lengthwise direction to function as a single external electrode (not shown) and a single external electrode (not shown). The lead electrodes 44d and 45d of the first and second negative electrode layers 44 and 45 are electrically connected to the external electrodes, respectively. Likewise, the external electrodes 46a of the piezoelectric layers 41 are aligned in the stacking direction in the middle of one of the short side surfaces of the piezoelectric element unit 440 in the widthwise direction to function as a single external electrode (not shown), to which the lead electrode 42d of the first positive electrode layer 42 is electrically connected. Further, the external electrodes 47a of the piezoelectric layers 41 are aligned in the stacking direction in the middle of the other short side surface of the piezoelectric element unit 440 in the widthwise direction to function as a single external electrode (not shown), to which the lead electrode 43d of the second positive electrode layer 43 is electrically connected.

Referring specifically to FIG. 16, the control unit 407 allows the amplifier 72b to amplify the voltage difference between first and second detection resistances R1 and R2 connected in series between the first and second negative electrode layers 44 and 45, respectively, and ground such that a change in the difference between the current flowing through the first detection resistance R1 and the current flowing through the second detection resistance R2 is detected.

As shown in FIG. 17, the first positive electrode layer 42 and the first negative electrode layer 44 are arranged in the direction of one diagonal line of the principle surface of the piezoelectric layer 41, while the second positive electrode layer 43 and the second negative electrode layer 45 are arranged in the direction of the other diagonal line of the principle surface of the piezoelectric layer 41. Therefore, the piezoelectric layer 41 sandwiched between the first positive electrode layer 42 having the first electrode 42a and the first negative electrode layer 44 having the first electrode 44a is more likely to be influenced by the change in contact pressure on one of the driver elements 49 (e.g., the left one in FIG. 3). At the same time, the piezoelectric layer 41 sandwiched between the second positive electrode layer 43 having the second electrode 43b and the second negative electrode layer 45 having the second electrode 45b is more likely to be influenced by the change in contact pressure on the other driver element 49 (e.g., the right one in FIG. 3). That is, the first positive and negative electrode layers 42 and 44 and the second positive and negative electrode layers 43 and 45 are influenced by the different driver elements 49. Therefore, a subtle difference between the contact pressure exerted on one of the driver elements 49 and that exerted on the other driver element 49 is detected by detecting the difference between the currents flowing through the first and second detection resistances R1 and R2. As a result, the position of the stage 11 is estimated with high precision.

Other Embodiments

Embodiments 1 to 4 of the present invention may be configured as follows.

According to Embodiments 1 to 4 described above, the ultrasonic actuator 2 is configured such that the actuator body 4 vibrates in the first mode of longitudinal vibration in the lengthwise direction and the second mode of bending vibration in harmony. However, the present invention is not limited thereto. The ultrasonic actuator 2 may generate other kinds of vibrations and other modes. The ultrasonic actuator 2 may be configured in any way as long as it functions as a vibration actuator in which the actuator body 4 vibrates to deliver the driving force caused by the friction between the driver elements 49 and the stage 11.

Figure 18:
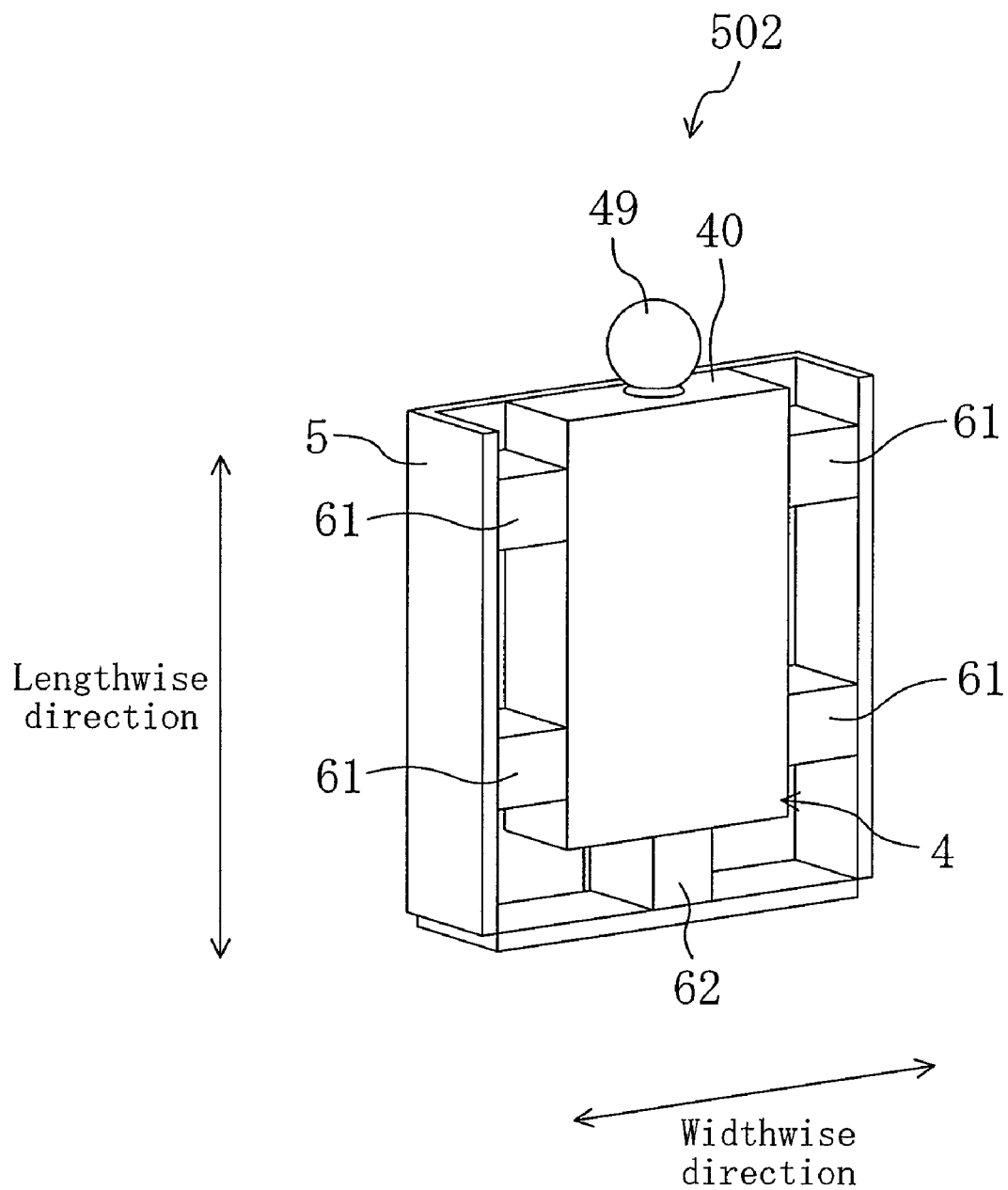
FIG. 18 is a perspective view of another embodiment of an ultrasonic actuator.

The configuration of the ultrasonic actuator 2 is not limited to that described above. For example, instead of feeding the piezoelectric element unit 40 via the support rubbers 61 and the bias rubber 62, leads may be connected to the piezoelectric element unit 40 to feed the piezoelectric element unit 40. The node of the vibration of the piezoelectric element unit 40 may be supported by an inelastic member. It is also possible to adopt an ultrasonic actuator 502 shown in FIG. 18 in which a single driver element 49 is provided on one of the short side surfaces of the piezoelectric element unit 40. With this configuration, the driver element 49 makes a circular motion as the piezoelectric element unit 40 generates the composite vibration of the first mode of longitudinal vibration in the lengthwise direction and the second mode of bending vibration such that the stage 11 moves in the predetermined moving direction (parallel to the widthwise direction) via the friction between the driver element 49 and the stage 11. Further, in place of the piezoelectric element unit 40 which functions as the actuator body 4, a structure prepared by adhering a piezoelectric element on a metal substrate or a resonator made of metal with a piezoelectric element sandwiched between may be used. In such a case, the resonator including the piezoelectric element functions as the actuator body.

Figure 19:
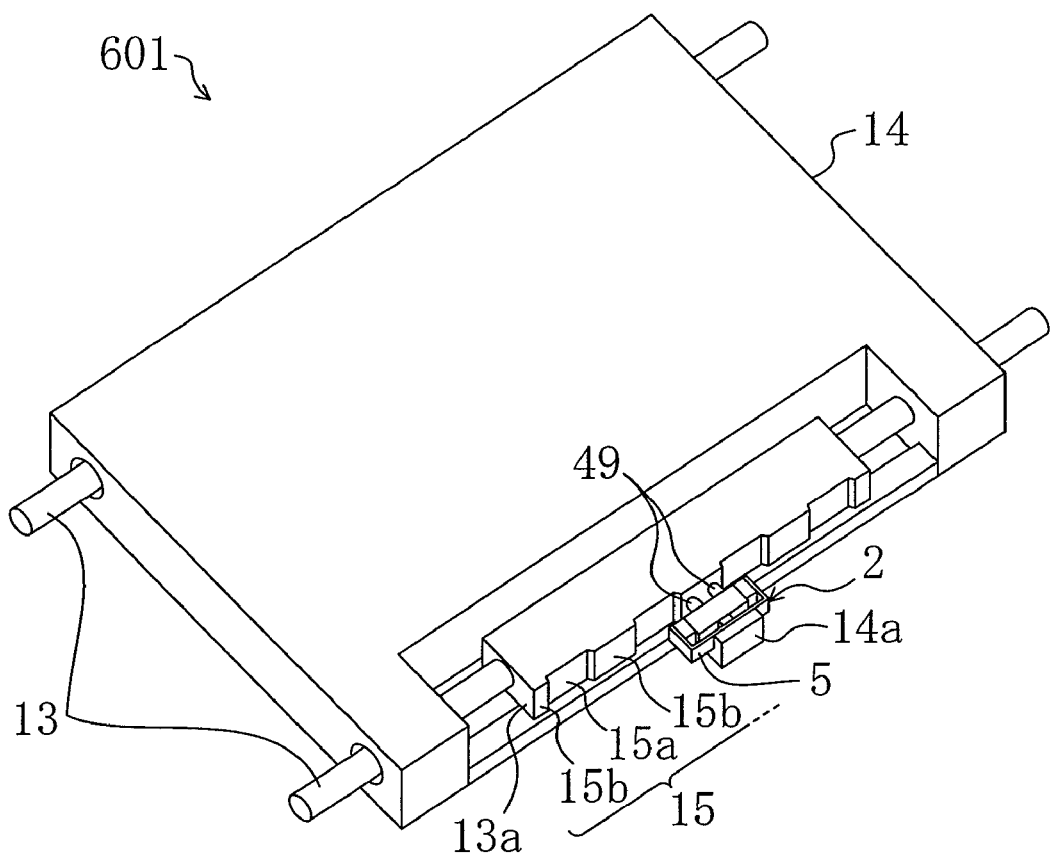
FIG. 19 is a perspective view of another embodiment of a drive unit.

In the above-described embodiments, the ultrasonic actuator 2 is fixed to the base and the driver elements 49 are brought into contact with the movable stage 11 and the ultrasonic actuator 2 is operated to drive the stage 11. However, as shown in FIG. 19, the ultrasonic actuator 2 may be fixed to the stage. Specifically, a drive unit 601 includes guides 13 fixed in parallel with each other on a base, a stage 14 slidably attached to the guides 13 and an ultrasonic actuator 2. One of the guides 13 is provided with an abutment 13a fixed to the guide 13. The stage 14 is provided with an actuator mount 14a. A case 5 is mounted on the actuator mount 14a of the stage 14 such that driver elements 49 of the ultrasonic actuator 2 are in contact with the abutment 13a of the guide 13. When the ultrasonic actuator 2 is operated in this state, the driver elements 49 deliver the driving force to the abutment 13a. Then, the ultrasonic actuator 2 vibrates relatively to the abutment 13a in the lengthwise direction of the guides 13 because the abutment 13a is fixed. As a result, the stage 14 joined with the case 5 via the actuator mount 14a is driven in the lengthwise direction of the guides 13. The abutment 13a has an undulating surface 15 in contact with the driver elements 49. The undulating surface 15 includes concavities 15a and convexities 15b arranged periodically in the moving direction of the stage 14. The undulating surface 15 shown in FIG. 19 is the same as that described in Embodiment 1. However, it may be configured in the same manner as the undulation of Embodiment 2 or 3.

According to the above-described embodiments, the detection of the stage position depends only on the change in contact pressure exerted on the driver elements 49 by the undulation of the stage. However, the present invention is not limited thereto. Specifically, the detection of the stage position based on the change in contact pressure on the driver elements 49 caused by the undulation of the stage according to the above-described embodiments may be combined with the detection of the stage position using an additionally provided position detection sensor. For example, undulations each having the position information are provided at certain positions of the stage as described in Embodiment 3 and the detection of the stage position between the undulations may be performed using the additionally provided position detection sensor. With this configuration, the size of the additionally provided position detection sensor is reduced as much as possible as compared with a drive unit which performs the detection of the stage position only by use of the additionally provided position detection sensor. Thus, the size increase of the drive unit is prevented and the detection of the stage position is performed by a simple configuration.

According to the above-described embodiments, the ultrasonic actuator 2 is operated by applying AC voltages having a frequency close to the antiresonance frequency of the piezoelectric element unit 40. However, the present invention is not limited thereto. Even if the ultrasonic actuator 2 is operated by applying AC voltages having other frequency, the contact pressure exerted on the driver elements 49 is obtained from the change in impedance of the piezoelectric element unit 40 (or the change in current flowing through the detection resistance R) as long as the relationship between the impedance and pressure applied to the piezoelectric element unit 40 at the other frequency is obtained in advance. Thus, the position of the stage is detected.

The change in impedance of the piezoelectric element unit 40 may be determined from parameters other than the change in current flowing through the detection resistance R. For example, the piezoelectric element unit 40 may be operated using a constant current drive circuit such that the impedance of the piezoelectric element unit 40 is detected from the change in voltage of the detection resistance R. Any other configuration may be applicable as long as a change in impedance or other property of the piezoelectric element unit 40 which varies as a function of contact pressure is detected.

It should be noted that the present invention is not limited to the above embodiment and various modifications are possible within the spirit and essential features of the present invention. The above embodiment shall be interpreted as illustrative and not in a limiting sense. The scope of the present invention is specified only by the following claims and the description of the specification is not limitative at all. Further, it is also to be understood that all the changes and modifications made within the scope of the claims fall within the scope of the present invention.

As described above, the present invention is useful for a drive unit which moves a movable body relative to a stationary body using a vibration actuator.

What is claimed is:

1. A drive unit comprising: a stationary body; a movable body which is movable relative to the stationary body; a vibration actuator using a piezoelectric element for moving the movable body; and a control section for controlling the vibration actuator by feeding the piezoelectric element, wherein the vibration actuator includes two driver elements spaced apart at an interval in a moving direction of the movable body and in contact with one of the movable body and the stationary body and is fixed to the other one of the movable body and the stationary body, a surface of the one of the movable body and the stationary body in contact with the driver element is an undulating surface, the control section detects the position of the movable body based on a change in contact pressure on the driver element due to the undulating surface, and the undulating surface includes at least one of a concavity and a convexity having a width larger than the interval between the driver elements.

2. A drive unit comprising: a stationary body; a movable body which is movable relative to the stationary body; a vibration actuator using a piezoelectric element for moving the movable body; and a control section for controlling the vibration actuator by feeding the piezoelectric element, wherein the vibration actuator includes a driver element in contact with one of the movable body and the stationary body and is fixed to the other one of the movable body and the stationary body, a surface of the one of the movable body and the stationary body in contact with the driver element is an undulating surface, the undulating surface includes at least one of a concavity and a convexity, an arrangement or a shape of the at least one of the concavity and the convexity in the undulating surface changes as a function of position along the undulating surface, and the control section detects the position of the movable body based on a change in contact pressure on the driver element due to the undulating surface.

3. A drive unit comprising: a stationary body; a movable body which is movable relative to the stationary body; a vibration actuator using a piezoelectric element for moving the movable body; and a control section for controlling the vibration actuator by feeding the piezoelectric element, wherein the vibration actuator includes two driver elements spaced apart at an interval in a moving direction of the movable body and in contact with one of the movable body and the stationary body and is fixed to the other one of the movable body and the stationary body, a surface of the one of the movable body and the stationary body in contact with the driver element is an undulating surface, the control section detects the position of the movable body based on a change in contact pressure on the driver element due to the undulating surface, and the undulating surface includes at least one of a concavity and a convexity having a width smaller than the interval between the driver elements.

4. A drive unit comprising: a stationary body; a movable body which is movable relative to the stationary body; a vibration actuator using a piezoelectric element for moving the movable body; and a control section for controlling the vibration actuator by feeding the piezoelectric element, wherein the vibration actuator includes two driver elements spaced apart at an interval in a moving direction of the movable body and in contact with one of the movable body and the stationary body and is fixed to the other one of the movable body and the stationary body, a surface of the one of the movable body and the stationary body in contact with the driver element is an undulating surface, the control section detects the position of the movable body based on a change in contact pressure on the driver element due to the undulating surface, the piezoelectric element has at least one piezoelectric body and at least two pairs of first and second electrodes provided to sandwich the at least one piezoelectric body, the first electrodes are arranged nearer to one of the two driver elements than the other, the second electrodes are arranged nearer to the other driver element than the one driver element, and the control section detects a difference between a contact pressure on one of the driver elements and a contact pressure on the other of the driver elements based on a current flowing through the first and second electrodes.

* * * * *